United States Patent
Chou et al.

(10) Patent No.: US 8,072,805 B2
(45) Date of Patent: Dec. 6, 2011

(54) METHOD AND SYSTEM OF FINDING A READ VOLTAGE FOR A FLASH MEMORY

(75) Inventors: Ming-Hung Chou, Hsinchu (TW); Chien-Fu Huang, Hsinchu (TW); Han-Lung Huang, Hsinchu (TW); Shih-Keng Cho, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 228 days.

(21) Appl. No.: 12/543,496

(22) Filed: Aug. 18, 2009

(65) Prior Publication Data

US 2011/0044101 A1     Feb. 24, 2011

(51) Int. Cl.
*G11C 16/04* (2006.01)
(52) U.S. Cl. .......... 365/185.03; 365/185.09; 365/185.18
(58) Field of Classification Search ............ 365/185.03, 365/185.18, 185.09
See application file for complete search history.

(56) References Cited

U.S. PATENT DOCUMENTS

2008/0263266 A1   10/2008  Sharon et al.
2009/0003058 A1*   1/2009  Kang ................... 365/185.03

FOREIGN PATENT DOCUMENTS

WO    WO2008/111058 A2    9/2008

* cited by examiner

*Primary Examiner* — Huan Hoang
(74) *Attorney, Agent, or Firm* — Squire, Sanders & Dempsey (US) LLP (57) ABSTRACT

A method and system of finding a read voltage for a flash memory is disclosed. Data are read from array cells of the flash memory with a default read voltage, and a recorded state bit number that is recorded during programming is also read. Determine an optimal read voltage if the readout data do not pass the error correction control (ECC). Data are then re-read from the array cells of the flash memory with the determined optimal read voltage.

22 Claims, 11 Drawing Sheets

METHOD AND SYSTEM OF FINDING A READ VOLTAGE FOR A FLASH MEMORY

BACKGROUND OF THE INVENTION

1. Field of the Invention

The present invention generally relates to a flash memory, and more particularly to a method and system of finding an optimal read voltage for a flash memory.

2. Description of the Prior Art

Flash memory is a non-volatile solid state memory device that can be electrically erased and reprogrammed, and is a specific type of electrically erasable programmable read-only memory (EEPROM) device. Conventional flash memory stores a single bit of information in each memory cell such that each memory cell can be programmed to assume two possible states. The conventional flash memory is thus commonly referred to as single-level cell (SLC) flash memory or single-bit cell (SBC) flash memory. Modern flash memory is capable of storing two or more bits of information in each memory cell such that each memory cell can be programmed to assume more than two possible states. The modern flash memory is thus commonly referred to as multi-level cell (MLC) flash memory or multi-bit cell (MBC) flash memory.

In the MLC flash memory, data of different state are programmed to the flash memory by storing different amount of charge in the floating gate of the flash memory. As the charge in the floating gate specifically determines the corresponding threshold voltage, the data can then be read from the MLC flash memory according to their different threshold voltage. Due to variations among the memory cells during the manufacture, operation or according to other factors, the threshold voltage of each state is not a constant value but a range. When the flash memory is being read, the threshold voltage of a cell is compared to read voltages to determine its state.

Figure 1:
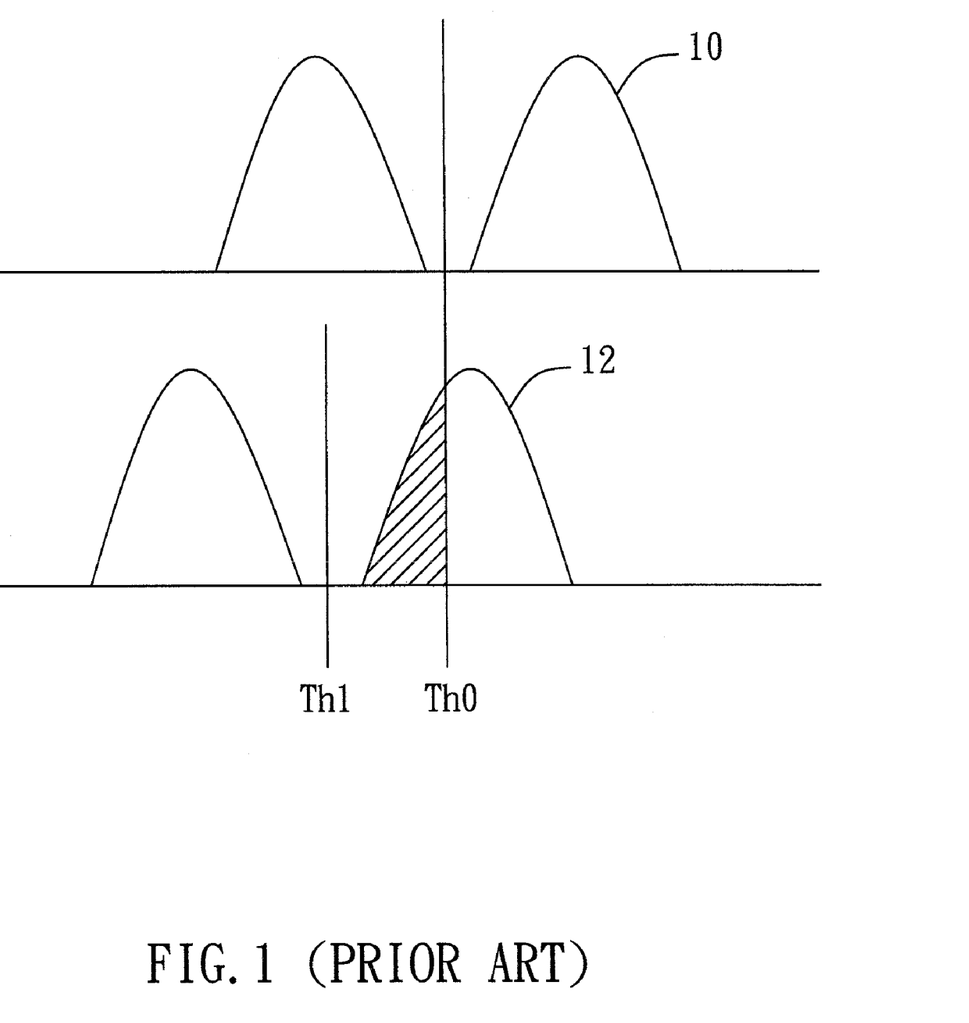
FIG. 1 shows error bits accompanied with a shifted threshold voltage distribution.

The read voltages for reading data from the traditional MLC flash memory are constant. In practice, however, the threshold voltage distribution may probably change after the flash memory has been subjected to a predetermined number of program/erase cycles or/and a predetermined data retention time has elapsed. For example, as shown in FIG. 1 (in which only two states are concerned and shown for illustrative purpose), the initial distribution 10 with read voltage Th0 may be suffered from retention issue after a long time not going through program/erase cycle, and therefore drifted downward to a shifted distribution 12 with a new read voltage Th1. A number of error bits (e.g., the shaded area) may incur if the initial read voltage Th0 is still used to read data from the flash memory.

For the reason that conventional MLC or SLC flash memory could probably result in read errors due to cycle/retention issue, a need has arisen to propose some novel schemes to obtain proper read voltages for reading data from the flash memory.

SUMMARY OF THE INVENTION

In view of the foregoing, it is an object of the present embodiment to provide a method and system of finding a proper or optimal read voltage for a flash memory in order to minimize the error bit number.

According to one embodiment, data are read from array cells of the flash memory with a default read voltage, and a recorded state bit number that is recorded during programming is also read. Determine whether the readout data passes error correction control (ECC), followed by determining an optimal read voltage if the readout data do not pass the ECC. Data are re-read from the array cells of the flash memory with the determined optimal read voltage.

DETAILED DESCRIPTION OF THE INVENTION

Figure 2A:
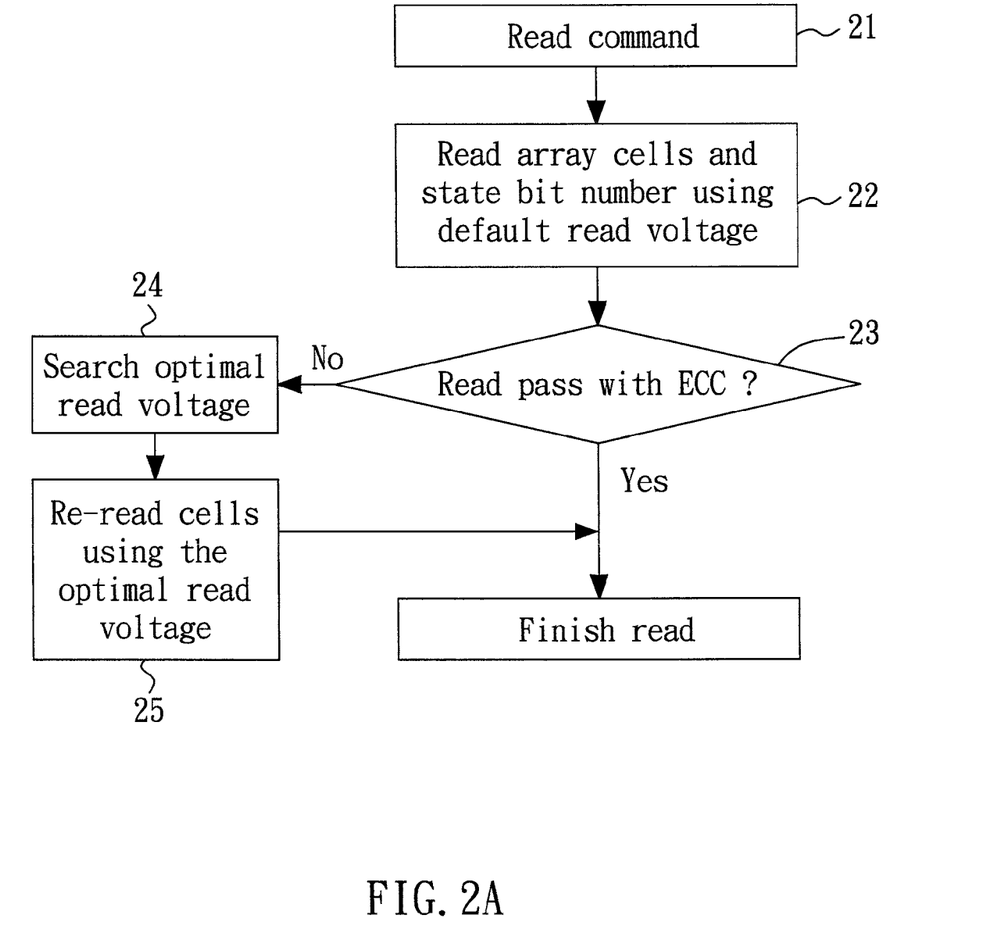
FIG. 2A is a flow diagram that illustrates a method of finding an optimal read voltage for a flash memory according to one embodiment of the present invention.

FIG. 2A is a flow diagram that illustrates a method of finding an optimal read voltage for a flash memory according to one embodiment of the present invention. The embodiment may be adapted to a multi-level cell (MLC) flash memory as well as a single-level cell (SLC) flash memory.

Referring to FIG. 2A, after the flash memory is requested by a read command (the step 21), data are read from array cells of the flash memory with a default or original read voltage, and the bit number of each state that has been recorded beforehand in spare or redundant cells, during programming, is also read (the step 22). If the reading passes the error correction control (ECC), in the step 23, that is applied to detect and correct error or errors, the reading finishes. Otherwise, an optimal read voltage is searched or determined in the step 24. The determined optimal read voltage may be stored, for example, in a register before its use. Afterwards, the array cells of the flash memory are re-read, in the step 25, using the determined read voltage.

Figure 2B:
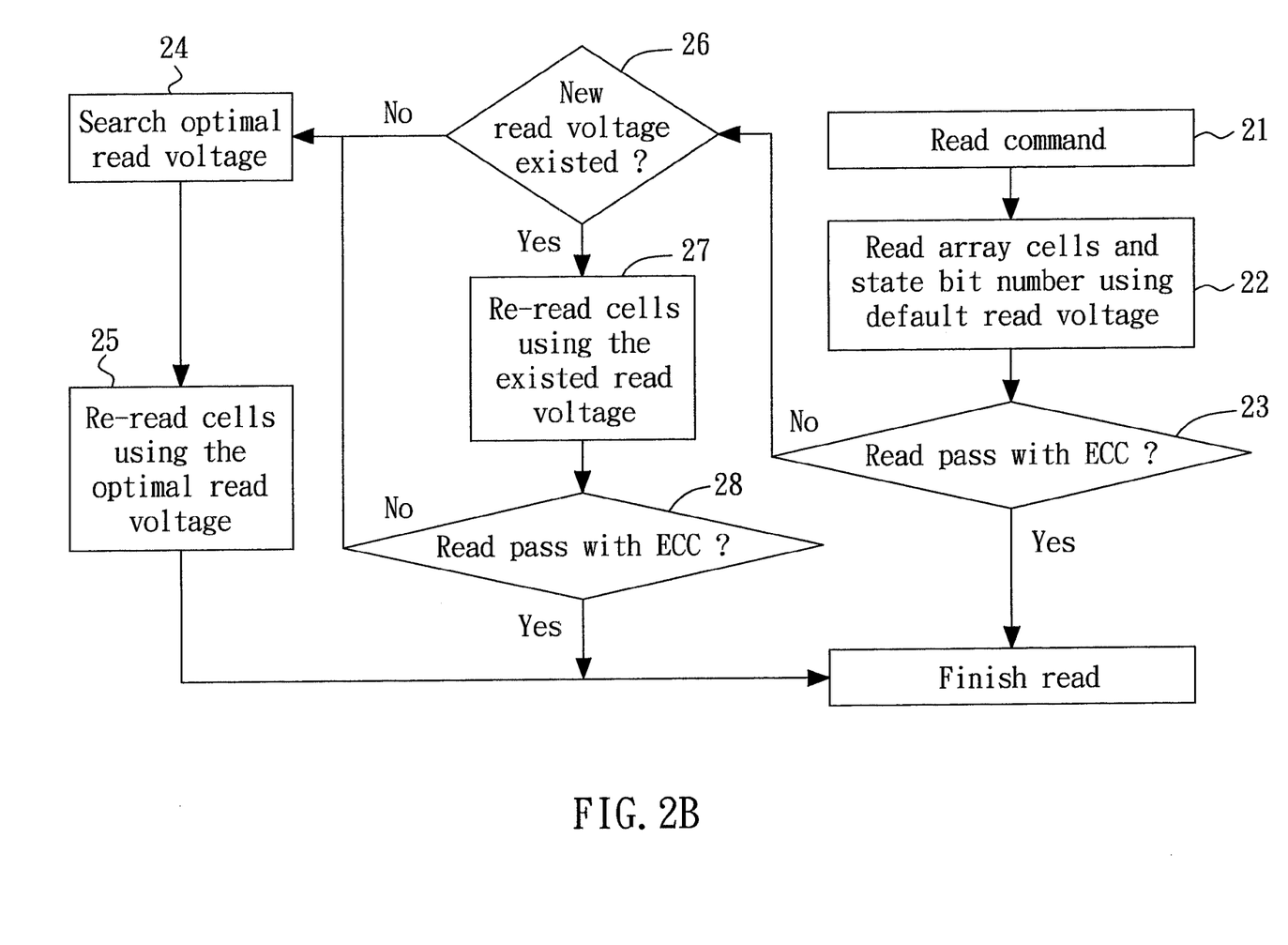
FIG. 2B is a flow diagram that illustrates a method of finding an optimal read voltage for a flash memory according to an embodiment alternative to that in FIG. 2A.

FIG. 2B is a flow diagram that illustrates a method of finding an optimal read voltage for a flash memory according to an embodiment alternative to that in FIG. 2A. In the embodiment shown in FIG. 2B, before the step 24 is performed, if any new read voltage exists (the step 26), then the existed read voltage may be used to re-read the flash memory (the step 27). For example, if an optimal read voltage has been determined for a neighboring page, that optimal read voltage may then be used for the present page to re-read the flash memory. After the re-reading in the step 27, determine whether the reading passes the error correction control (ECC) (the step 28). If the reading still does not pass the ECC, the read voltage searching step 24 is then performed.

Figure 3A:
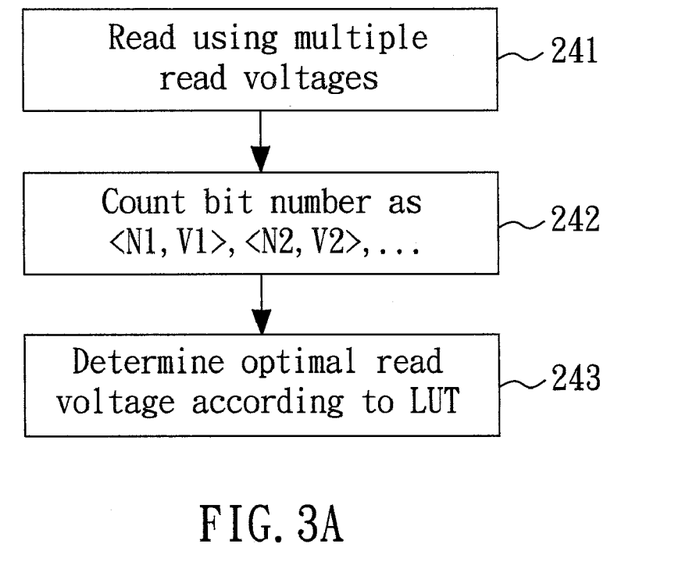
FIG. 3A shows a detailed flow diagram of the optimal read voltage determination step in FIG. 2A or FIG. 2B according to a first embodiment of the present invention.
Figure 3B:
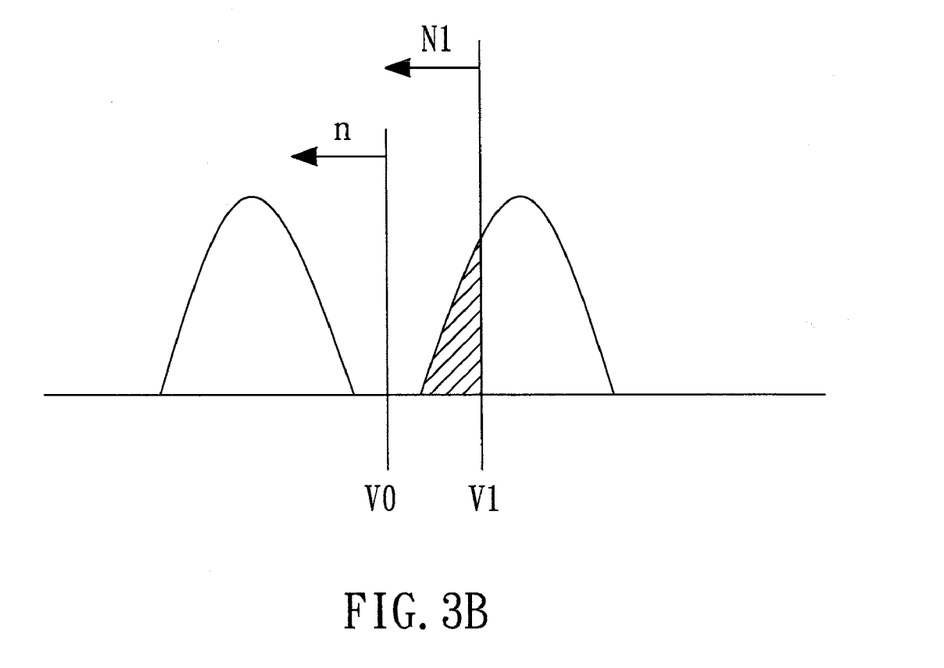
FIG. 3B illustrates the concept of the failure bit number.

FIG. 3A shows a detailed flow diagram of the step 24 (of FIG. 2A or FIG. 2B) for determining the optimal read voltage according to a first embodiment of the present invention. In the embodiment, a page (or any specific amount) is read from the flash memory many times using multiple read voltages respectively (the step 241). Next, in the step 242, the (cumulative) bit numbers (e.g., N1, N2, etc.) respectively corresponding to the read voltages (e.g., V1, V2, etc.) are counted, for example, as <N1,V1>, <N2,V2>, etc. Subsequently, in the step 243, an optimal read voltage or offset voltage is determined according to a predetermined lookup table (LUT) that maps a failure ratio (or a failure bit number) to a read voltage (or offset voltage). FIG. 3B illustrates the concept of the failure bit number. As shown in the figure, the recorded (cumulative) bit number of state "1" using a default read voltage V0 is n, and the counted (cumulative) bit number of the state "1" using the read voltage V1 is N1. Therefore, the failure ratio F1 with respect to the read voltage V1 is (N1−n)/n. Similarly, the failure ratio F2 with respect to a read voltage V2 is (N2−n)/n, where N2 is the associated counted bit number of state "1." A lookup table is exemplified in the following Table 1. Specifically, the left column of Table 1 lists failure ratio with respect to each read voltage in the right column. Based on the lookup table, the optimal read voltage (or the offset voltage) may then be determined according to the failure ratio resulted from the reading in the step 241.

TABLE 1

| Failure ratio | Read voltage |
|---|---|
| F1 | V1 |
| F2 | V2 |
| F3 | V3 |
| ... | ... |
| Fn | Vn |

It is appreciated that the failure ratio in the left column of Table 1 may be replaced with the failure bit number if all the states are uniformly distributed such that all the state bit numbers n are substantially the same. Moreover, the read voltage in the right column may be replaced with the offset voltage that is the difference between the read voltage and the default (or original) read voltage V0.

Figure 3C:
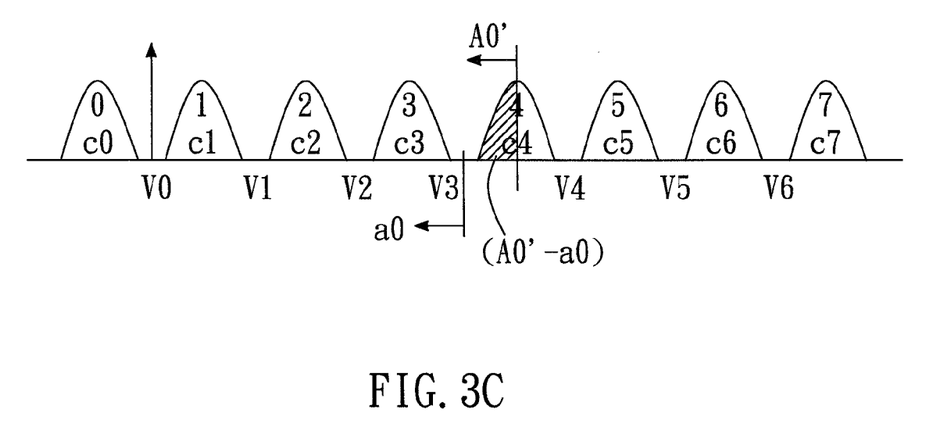
FIG. 3C shows a further example that illustrates finding the failure ratio for a 3-bit MLC flash memory.

FIG. 3C shows a further example that illustrates finding the failure ratio for a 3-bit MLC flash memory that has 8 states. In the figure, a0 is the recorded bit number for the state "1" that is recorded beforehand during the programming, and A0' is the counted bit number for the state "1" during reading. The shaded area, or (A0'−a0), is the failure bit number of the state c4. The failure ratio of the state c4 is the ratio of the failure bit number to the bit number (c4) of the state c4, or (A0'−a0)/c4.

Figure 4A:
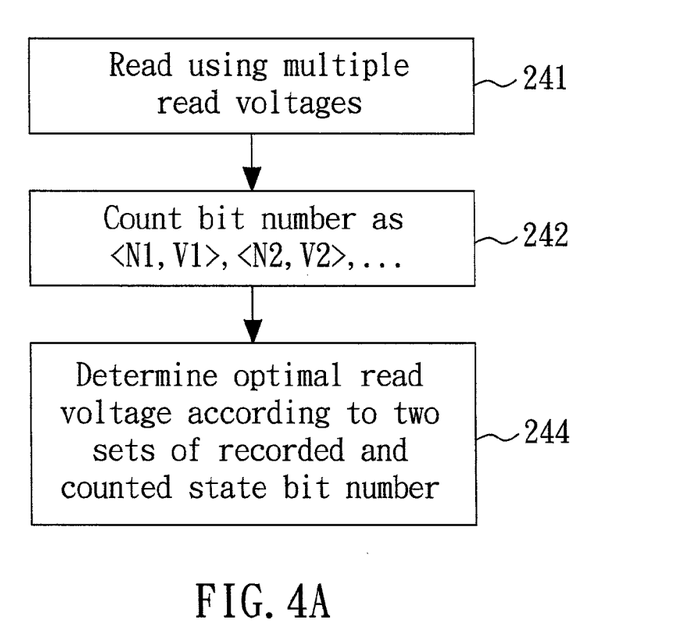
FIG. 4A shows a detailed flow diagram of the optimal read voltage determination step in FIG. 2A or FIG. 2B according to a second embodiment of the present invention.
Figure 4B:
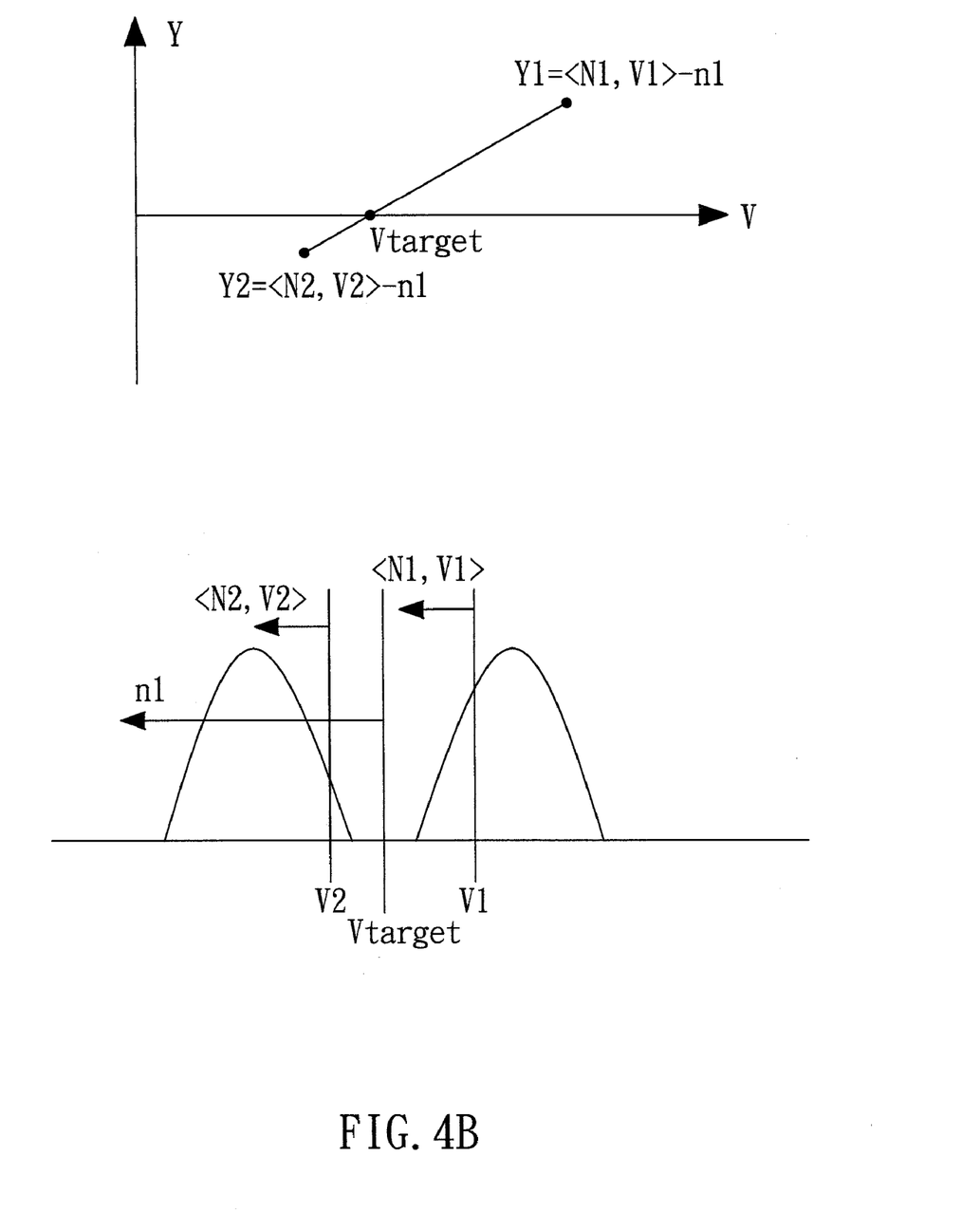
FIG. 4B shows an example of finding the optimal read voltage by interpolation.
Figure 4C:
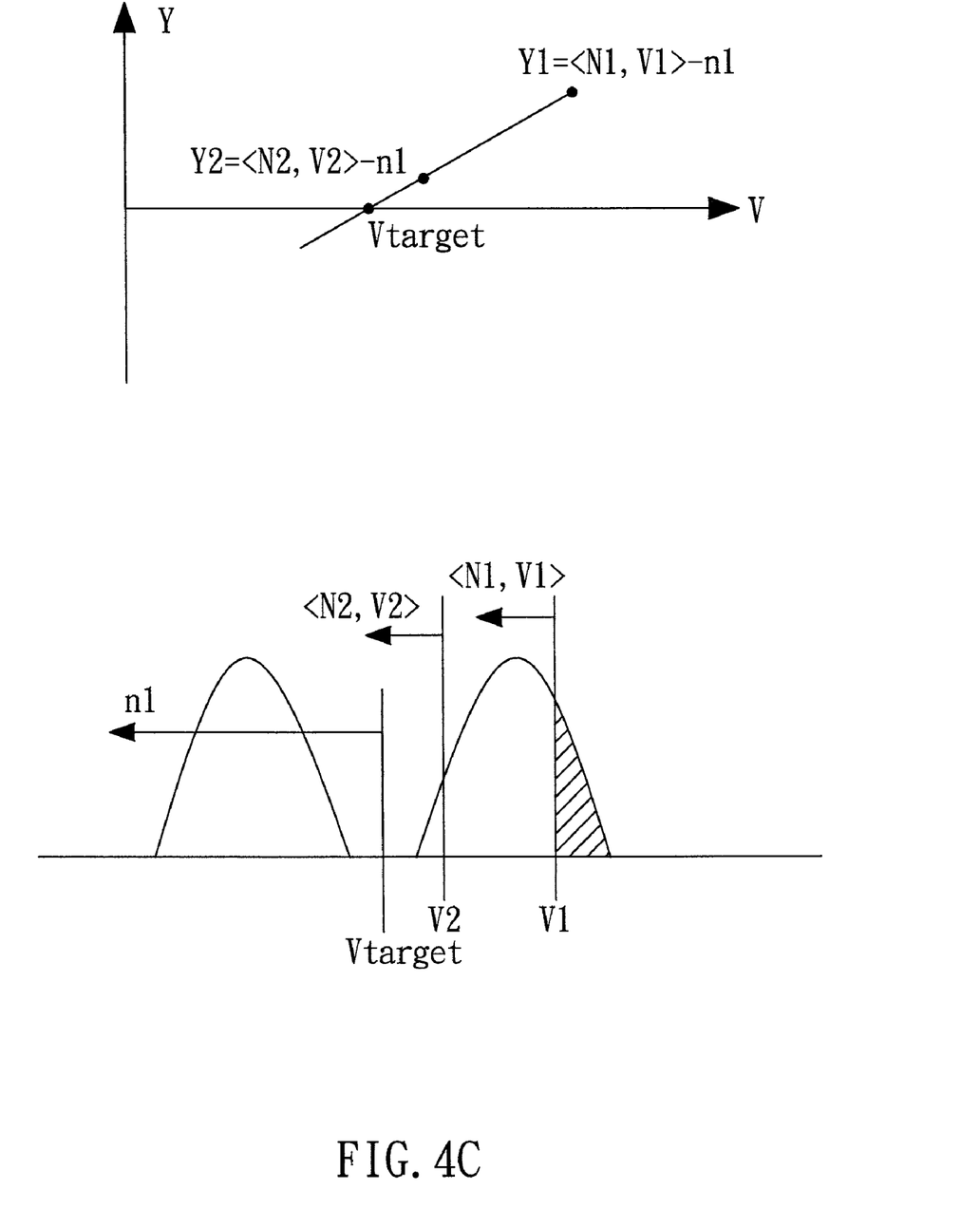
FIG. 4C shows an example of finding the optimal read voltage by extrapolation.

FIG. 4A shows a detailed flow diagram of the step 24 (of FIG. 2A or FIG. 2B) for determining the optimal read voltage according to a second embodiment of the present invention. The flow diagram in FIG. 4A is similar to that in FIG. 3A except that the step 243 is now replaced with the step 244, in which the optimal read voltage is determined according to at least two sets of the recorded state bit number (during the programming) and the counted bit number (during the reading). For example, n1 is the recorded bit number for the state "1," N1 is the first counted bit number for the state "1" using a first read voltage V1, and N2 is the second counted bit number for the state "1" using a second read voltage V2. FIG. 4B shows an example in which the Y axis represents the counted state bit number minus the recorded state bit number, and the X axis represents the associated read voltage. The optimal interpolated read voltage $V_{target}$ between V1 and V2 has a state bit number equal to the counted state bit number n1. FIG. 4C shows a further example in which the optimal extrapolated read voltage $V_{target}$ of V1 and V2 has a state bit number equal to the recorded state bit number n1. Although interpolation/extrapolation optimization process is used in the embodiment, it is appreciated that other optimization process, such as linear regression analysis (LRA), maximum likelihood estimation (MLE), expectation maximization (EM) or binary search, may be used instead.

According to the embodiments described above, an optimal read voltage may be determined and then utilized to read the array cells of the flash memory with minimized failure (or error) bit number due to threshold voltage shift.

Figure 5A:
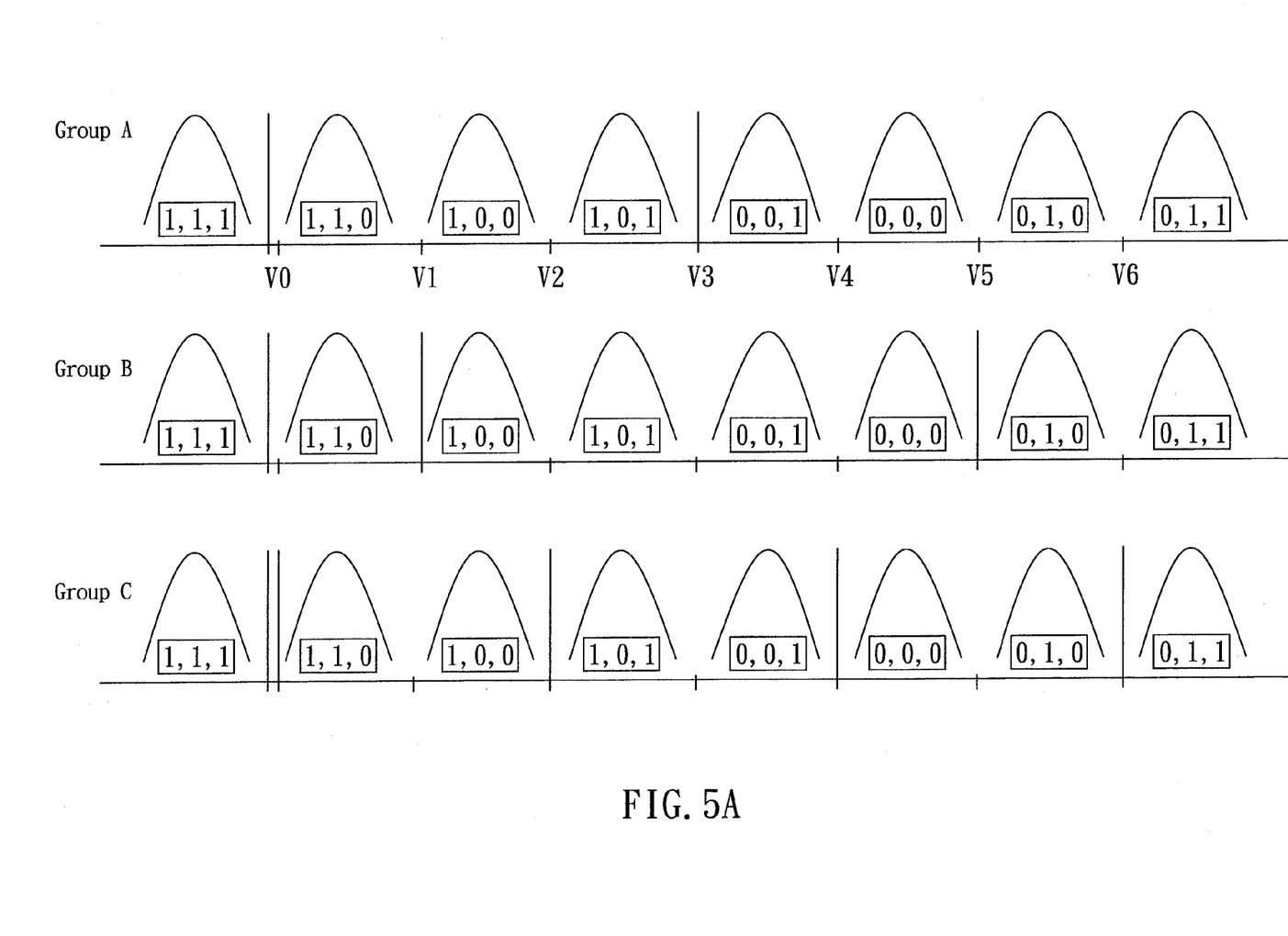
FIG. 5A shows a process of effectively reading a 3-bit MLC flash memory.

In order to facilitate the effectiveness of programming/reading a MLC flash memory, an effective method of recording the state bit number is adopted in the embodiment. FIG. 5A shows a process of effectively reading a 3-bit MLC flash memory. Specifically, group A is read using read voltage V3; followed by reading group B using read voltages V1 and V5; and finally group C is read using read voltages V0, V2, V4 and V6. In order to make sure the correctness and the reliability, the state bit numbers are programmed in a sequence as illustrated in Table 2 and depicted in FIG. 5B. According to this program sequence, read margin and reliability for each state can be substantially maximized.

TABLE 2

Figure 5B:
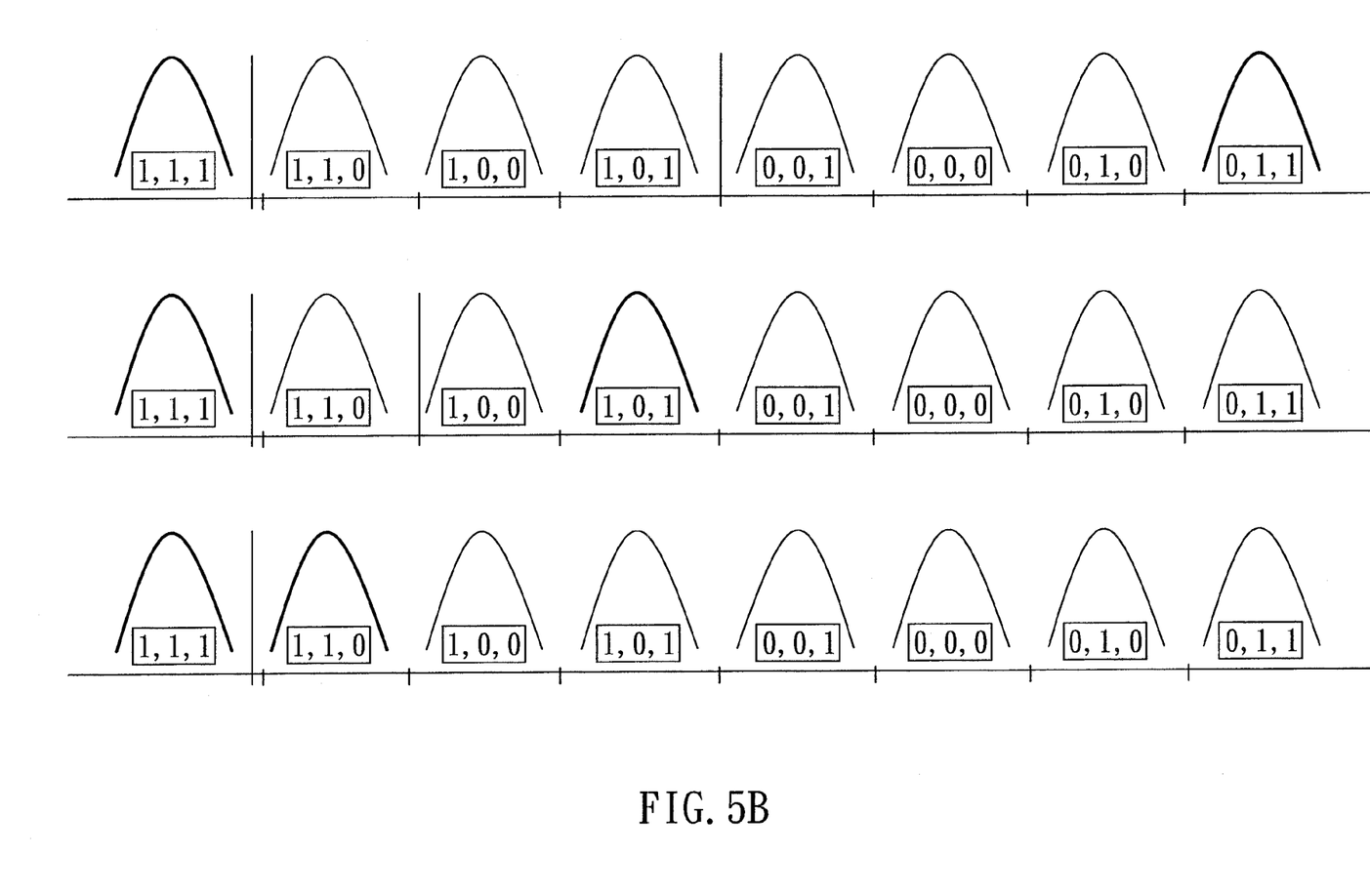
FIG. 5B shows a sequence according to which the state bit numbers are programmed.

| bit number to be recorded | state | Program sequence A | B | C |
|---|---|---|---|---|
| A | 1 | 1 | 1 | 1 |
|   | 0 | 0 | 1 | 1 |
| B | 1 | 1 | 1 | 1 |
|   | 0 | 1 | 0 | 1 |
| C | 1 | 1 | 1 | 1 |
|   | 0 | 1 | 1 | 0 |

According to one aspect of the present embodiment, the recorded space in the flash memory may be minimized by reducing the recorded state bit number. Table 3 shows an example in which only some portions of the state bit numbers are recorded, while other portions (that are in parenthesis) of the state bit numbers may be derived according to the recorded ones. Assume the page number is N, then the non-recorded state bit numbers may be derived as follows:

Group A: a1=N−a0;
Group B: b1=a0−b0, b2=a1−b3=N−a0−b3;
Group C: c1=b0−c0, c2=b1−c3=a0−b0−c3, c5=b2−c4=a1−b3−c4, c6=b3−c7.

TABLE 3

| A | | | (a0) | | | | a1 | |
|---|---|---|---|---|---|---|---|---|
| B | | (b0) | | | b1 | | b2 | (b3) |
| C | (c0) | c1 | c2 | (c3) | (c4) | c5 | c6 | (c7) |
| A | | | 1 | | | | 0 | |
| B | | 1 | | | 0 | | 0 | 1 |
| C | 1 | 0 | 0 | 1 | 1 | 0 | 0 | 1 |

Figure 6A:
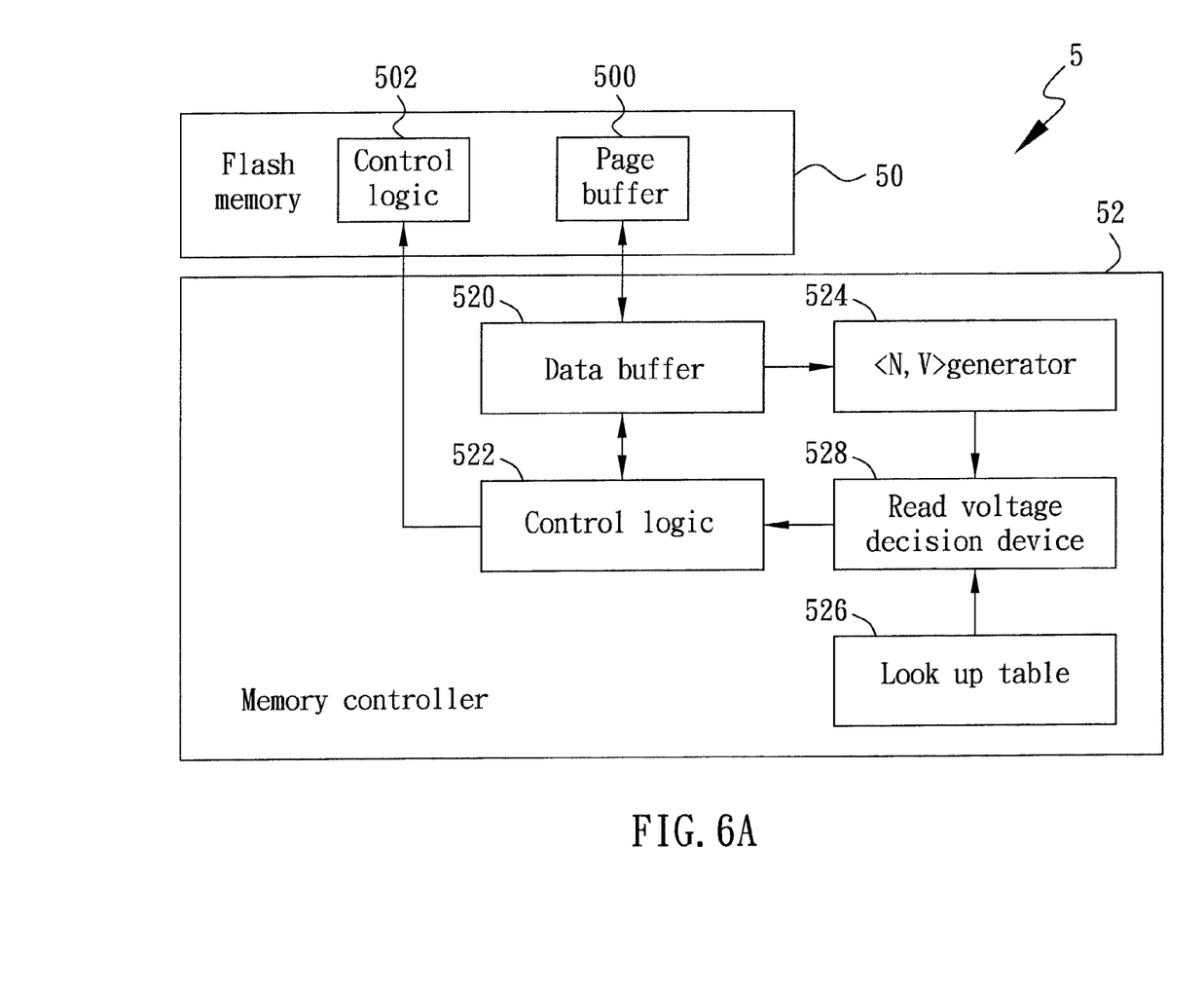
FIG. 6A shows a block diagram that illustrates a system of finding an optimal read voltage for a flash memory according to the first embodiment with respect to FIG. 2A/2B and FIG. 3A.

FIG. 6A shows a block diagram that illustrates a system 5 of finding an optimal read voltage for a flash memory according to the first embodiment with respect to FIG. 2A/2B and FIG. 3A. The system 5 includes a flash memory 50 and a memory controller 52. Data may be programmed to or read from the flash memory 50 from/to a host (not shown) through the memory controller 52. Regarding the flash memory 50, the data being programmed to or read from the array cells (not shown) of the flash memory 50 may be temporarily stored in a page buffer 500, and operation and timing of the flash memory 50 may be managed by control logic 502. Regarding the memory controller 52, a data buffer 520 is used for temporarily storing data and for interfacing with the flash memory 50, and control logic 522 is used for managing the operation and timing of the memory controller 52.

The memory controller 52 further includes a data pair <N,V> generator 524 that generates the (cumulative) bit numbers (e.g., N1, N2, etc.) respectively corresponding to the read voltages (e.g., V1, V2, etc.) in the step 242 (FIG. 3A). The memory controller 52 also includes a read voltage decision device 528 that performs the step 243 (FIG. 3A) for determining the optimal read voltage or offset voltage according to a predetermined lookup table (LUT) 526 that maps a failure ratio (or a failure bit number) to a read voltage (or offset voltage).

Figure 6B:
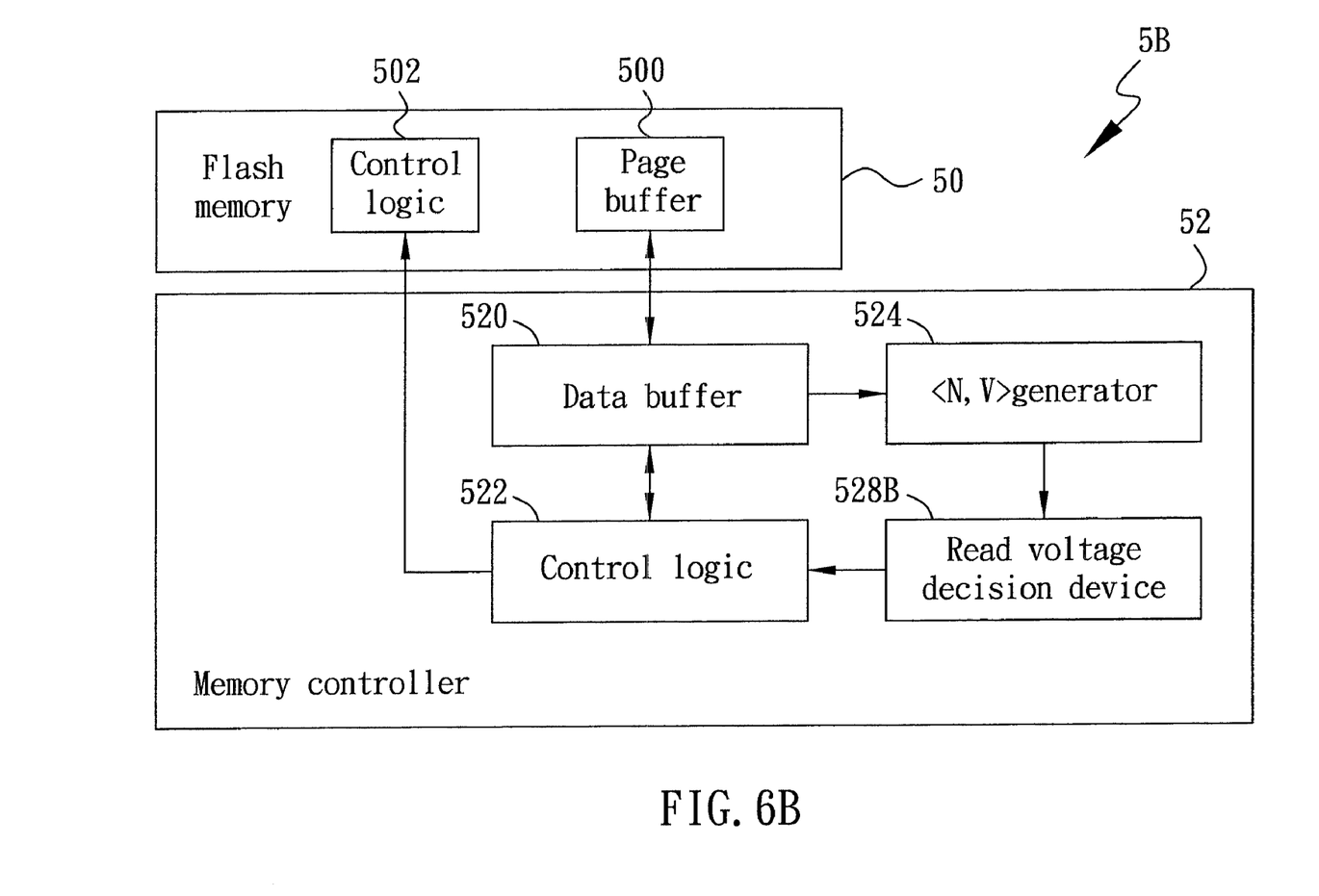
FIG. 6B shows a block diagram that illustrates a system of finding an optimal read voltage for a flash memory according to the second embodiment with respect to FIG. 2A/2B and FIG. 4A.

FIG. 6B shows a block diagram that illustrates a system 5B of finding an optimal read voltage for a flash memory according to the second embodiment with respect to FIG. 2A/2B and FIG. 4A. The system 5B is similar to the system 5 except that the read voltage decision device 528B performs the step 244 (FIG. 4A) for determining the optimal read voltage according to at least two sets of the recorded state bit number (during the programming) and the counted bit number (during the reading). In this second embodiment, no lookup table is need in the system 5B.

Although specific embodiments have been illustrated and described, it will be appreciated by those skilled in the art that various modifications may be made without departing from the scope of the present invention, which is intended to be limited solely by the appended claims.

What is claimed is:

1. A method of finding a read voltage for a flash memory, comprising:
    reading data from array cells of the flash memory with a default read voltage;
    reading a recorded state bit number of each state that is recorded during programming using the default read voltage;
    determining whether the readout data passes error correction control (ECC); and
    determining an optimal read voltage if the readout data do not pass the ECC, and re-reading data from the array cells of the flash memory with the determined optimal read voltage;
    wherein the step of determining the optimal read voltage comprises:
        reading a page at least one time using at least one associated read voltage for each time;
        counting at least one state bit number respectively corresponding to the at least one read voltage; and
        determining the optimal read voltage according to the recorded state bit number and the counted state bit number.

2. The method of claim 1, wherein the flash memory is a multi-level cell (MLC) flash memory.

3. The method of claim 1, further comprising a step of storing the determined optimal read voltage.

4. The method of claim 1, before the step of determining the optimal read voltage, further comprising a step of re-reading data from the array cells of the flash memory with an existed read voltage.

5. The method of claim 1, the step of determining the optimal read voltage further comprises:
    determining the optimal read voltage according to a predetermined lookup table (LUT) that maps a failure ratio to one of the multiple read voltages.

6. The method of claim 5, wherein the failure ratio is a ratio of failure bit number to the recorded state bit number.

7. The method of claim 5, wherein the lookup table maps a failure bit number to one of the multiple read voltages.

8. The method of claim 1, the step of determining the optimal read voltage further comprises:
    determining the optimal read voltage according to at least two sets of the recorded state bit number and the counted state bit number.

9. The method of claim 8, wherein interpolation or extrapolation is performed on the two sets of the recorded state bit number and the counted state bit number, resulting in an interpolated or extrapolated read voltage as the optimal read voltage corresponding to the recorded state bit number.

10. The method of claim 8, wherein the optimal read voltage is determined according to a first difference of the recorded state bit number and a first counted state bit number, and a second difference of the recorded state bit number and a second counted state bit number.

11. The method of claim 1, further comprising a step of deriving a state bit number according to the recorded state bit number and a page number.

12. A system of finding a read voltage for a flash memory, comprising:
    a data buffer for storing data read from array cells of the flash memory with a default read voltage, and a recorded state bit number of each state that is recorded during programming using the default read voltage;
    a read voltage decision device for:
        determining whether the readout data passes error correction control (ECC); and
        determining an optimal read voltage if the readout data do not pass the ECC, and re-reading data from the array cells of the flash memory with the determined optimal read voltage;
    a data pair generator for reading a page at least one time using at least one associated read voltage for each time, and counting at least one state bit numbers respectively corresponding to the at least one read voltage, wherein the optimal read voltage is determined according to the recorded state bit number and the counted state bit number.

13. The system of claim 12, wherein the flash memory is a multi-level cell (MLC) flash memory.

14. The system of claim 12, further comprising a register for storing the determined optimal read voltage.

15. The system of claim 12, before the optimal read voltage is determined, the read voltage decision device further re-reads data from the array cells of the flash memory with an existed read voltage.

16. The system of claim 12, further comprising:
    a lookup table that maps a failure ratio to one of the multiple read voltages, wherein the lookup table is used for determining the optimal read voltage.

17. The system of claim 16, wherein the failure ratio is a ratio of failure bit number to the recorded state bit number.

18. The system of claim 16, wherein a lookup table maps a failure bit number to one of the multiple read voltages.

19. The system of claim 12,
wherein the optimal read voltage is determined according to at least two sets of the recorded state bit number and the counted state bit number.

20. The system of claim 19, wherein the read voltage decision device performs interpolation or extrapolation on the two sets of the recorded state bit number and the counted state bit number, resulting in an interpolated or extrapolated read voltage as the optimal read voltage corresponding to the recorded state bit number.

21. The system of claim 19, wherein the optimal read voltage is determined according to a first difference of the recorded state bit number and a first counted state bit number, and a second difference of the recorded state bit number and a second counted state bit number.

22. The system of claim 12, wherein the read voltage decision device further derives a state bit number according to the recorded state bit number and a page number.

* * * * *